(12) United States Patent
Lenchenkov et al.

(10) Patent No.: US 10,079,256 B2
(45) Date of Patent: Sep. 18, 2018

(54) IMAGE SENSOR PIXELS WITH LIGHT GUIDES AND LIGHT SHIELD STRUCTURES

(71) Applicant: SEMICONDUCTOR COMPONENTS INDUSTRIES, LLC, Phoenix, AZ (US)

(72) Inventors: Victor Lenchenkov, Sunnyvale, CA (US); Dongqing Cao, San Jose, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/274,921

(22) Filed: Sep. 23, 2016

(65) Prior Publication Data

US 2017/0012071 A1 Jan. 12, 2017

Related U.S. Application Data

(63) Continuation of application No. 14/011,660, filed on Aug. 27, 2013, now Pat. No. 9,478,574.

(60) Provisional application No. 61/703,226, filed on Sep. 19, 2012.

(51) Int. Cl.
*H04N 3/14* (2006.01)
*H04N 5/335* (2011.01)
*H01L 27/146* (2006.01)
*H04N 5/225* (2006.01)

(52) U.S. Cl.
CPC .... *H01L 27/14623* (2013.01); *H01L 27/1462* (2013.01); *H01L 27/1463* (2013.01); *H01L 27/14601* (2013.01); *H01L 27/14621* (2013.01); *H01L 27/14625* (2013.01); *H01L 27/14627* (2013.01); *H01L 27/14629* (2013.01); *H01L 27/14636* (2013.01); *H01L 27/14645* (2013.01); *H01L 27/14685* (2013.01); *H04N 5/2254* (2013.01); *H04N 5/335* (2013.01); *H01L 27/14607* (2013.01)

(58) Field of Classification Search
CPC ....... H04N 27/14601; H04N 27/14607; H04N 27/14623; H04N 27/14625; H04N 27/27; H04N 27/14629; H04N 27/1463; H04N 27/14636; H04N 27/14643
USPC ................. 348/296, 308–310; 257/433–434
See application file for complete search history.

(56) References Cited

U.S. PATENT DOCUMENTS

| | | | |
|---|---|---|---|
| 5,654,811 A | 8/1997 | Spitzer et al. | |
| 6,043,800 A | 3/2000 | Spitzer et al. | |
| 6,414,783 B2 | 7/2002 | Zavracky et al. | |
| 7,323,814 B2 | 1/2008 | Miyazaki et al. | |
| 7,339,155 B2 * | 3/2008 | Lee ................... | H01L 27/14623 250/208.1 |

(Continued)

*Primary Examiner* — Ngoc-Yen Vu
(74) *Attorney, Agent, or Firm* — Treyz Law Group, P.C.

(57) ABSTRACT

A front-side illuminated image sensor with an array of image sensor pixels is provided. Each image pixel may include a photodiode, transistor gate structures, shallow trench isolation structures, and other associated pixel circuits formed in a semiconductor substrate. Buried light shielding structures that are opaque to light may be formed over regions of the substrate to prevent the transistor gate structures, shallow trench isolation structures, and the other associated pixel circuits from being exposed to stray light. Buried light shielding structures formed in this way can help reduce optical pixel crosstalk.

18 Claims, 4 Drawing Sheets

(56) References Cited

U.S. PATENT DOCUMENTS

| | | | |
|---|---|---|---|
| 7,550,797 B2* | 6/2009 | Suzuki | H01L 27/1462 257/291 |
| 7,968,888 B2 | 6/2011 | Yamaguchi et al. | |
| 8,493,487 B2* | 7/2013 | Takada | H01L 27/14603 348/308 |
| 8,530,812 B2 | 9/2013 | Kikuchi | |
| 8,619,170 B2* | 12/2013 | Mabuchi | H04N 5/35581 348/294 |
| 8,835,981 B2 | 9/2014 | Oishi | |
| 8,860,862 B2 | 10/2014 | Kobayashi et al. | |
| 9,041,081 B2 | 5/2015 | Lenchenkov | |
| 9,153,612 B2* | 10/2015 | Miyanami | H01L 27/14621 |
| 2008/0150062 A1* | 6/2008 | Hwang | G02B 3/0012 257/432 |
| 2009/0250594 A1* | 10/2009 | Tanaka | G02B 5/201 250/208.1 |
| 2015/0076643 A1 | 3/2015 | Kikuchi | |

\* cited by examiner

IMAGE SENSOR PIXELS WITH LIGHT GUIDES AND LIGHT SHIELD STRUCTURES

This application is a continuation of patent application Ser. No. 14/011,660, filed Aug. 27, 2013, which claims the benefit of provisional patent application No. 61/703,226, filed Sep. 19, 2012, which are hereby incorporated by reference herein in their entireties.

BACKGROUND

This relates generally to image sensors, and more specifically, to image sensors with light guides.

Image sensors are commonly used in electronic devices such as cellular telephones, cameras, and computers to capture images. Conventional image sensors are fabricated on a semiconductor substrate using complementary metal-oxide-semiconductor (CMOS) technology or charge-coupled device (CCD) technology. The image sensors may include an array of image sensor pixels each of which includes a photodiode and other operational circuitry such as transistors formed in the substrate.

A dielectric stack is formed on the substrate over the photodiodes. The dielectric stack includes metal routing lines and metal vias formed in silicon oxide. Light guides are often formed in the dielectric stack to guide the trajectory of incoming light. A color filter array is formed over the dielectric stack to provide each pixel with sensitivity to a certain range of wavelengths. Microlenses are formed over the color filter array. Light enters the microlenses and travels through the color filters into the dielectric stack.

Ideally, light entering the dielectric stack is directed to corresponding photodiodes using the light guides. In practice, however, stray light can exit the light guides at odd angles, and regions on the substrate in between neighboring photodiodes may be inadvertently exposed to light. Regions on the substrate where light should not be allowed to enter may be referred to as "dark" regions. Pixel circuit structures such as polysilicon gate conductors and shallow trench isolation (STI) structures are usually formed in these interposing dark regions. Light hitting the silicon oxide/polysilicon interface and the STI/silicon substrate interface may be scattered in random directions, which results in elevated optical pixel crosstalk and a degraded pixel modulation transfer function (MTF).

It would therefore be desirable to be able to provide improved image sensors.

DETAILED DESCRIPTION

Embodiments of the present invention relate to image sensors, and more particularly, to front-side illuminated image sensors with light guides. It will be recognized by one skilled in the art, that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices include image sensors that gather incoming light to capture an image. The image sensors may include arrays of imaging pixels. The pixels in the image sensors may include photosensitive elements such as photodiodes that convert the incoming light into image signals. Image sensors may have any number of pixels (e.g., hundreds or thousands of pixels or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
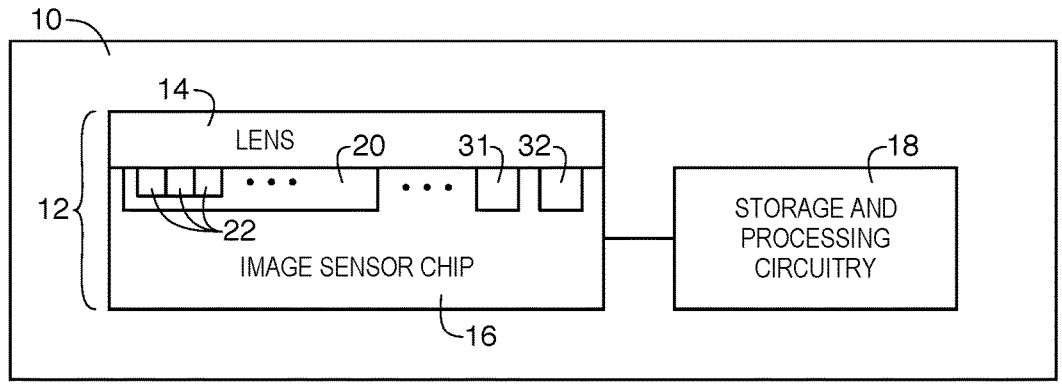
FIG. 1 is a diagram of an illustrative electronic device in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. Image sensor 16 may be an image sensor system-on-chip (SOC) having additional processing and control circuitry such as analog control circuitry 31 and digital control circuitry 32 on a common image sensor integrated circuit die with image pixel array 20 or on a separate companion die/chip.

During image capture operations, light from a scene may be focused onto an image pixel array (e.g., array 20 of image pixels 22) by lens 14. Image sensor 16 provides corresponding digital image data to analog circuitry 31. Analog circuitry 31 may provide processed image data to digital circuitry 32 for further processing. Circuitry 31 and/or 32 may also be used in controlling the operation of image sensor 16. Image sensor 16 may, for example, be a backside illumination image sensor. If desired, camera module 12 may be provided with an array of lenses 14 and an array of corresponding image sensors 16.

Device 10 may include additional control circuitry such as storage and processing circuitry 18. Circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be further processed and/or stored using processing circuitry 18. Processed image data may, if desired, be provided to external equipment (e.g., a computer or other device) using wired and/or wireless communications paths coupled to processing circuitry 18. Processing circuitry 18 may be used in controlling the operation of image sensors 16.

Image sensors 16 may include one or more arrays 20 of image pixels 22. Image pixels 22 may be formed in a semiconductor substrate using complementary metal-oxide-semiconductor (CMOS) technology or charge-coupled device (CCD) technology or any other suitable photosensitive devices.

Figure 2:
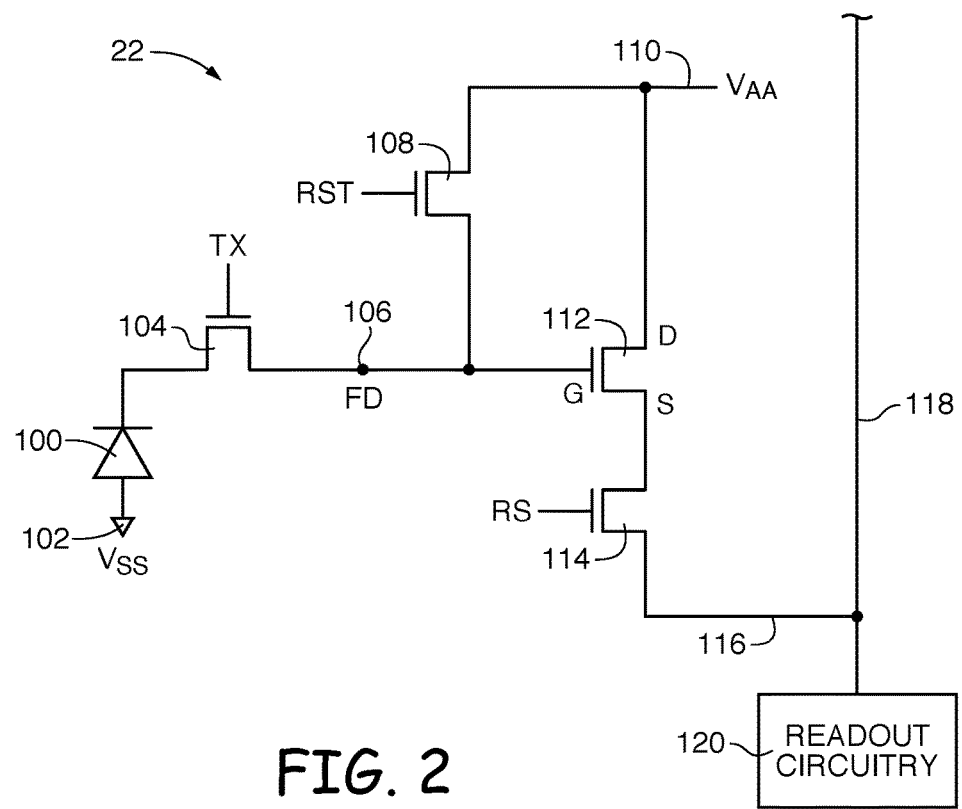
FIG. 2 is a circuit diagram of an illustrative image sensor pixel in accordance with an embodiment of the present invention.

FIG. 2 is a circuit diagram of an image sensor pixel 22. As shown in FIG. 2, image pixel 22 includes a photosensitive element such as photodiode 100, a charge transfer transistor 104, a reset transistor 108, a source follower transistor 112, and a row select transistor 114. A positive power supply voltage (e.g., positive power supply voltage Vaa or another reset-level voltage) is supplied at positive power supply terminal 110. A ground power supply voltage (e.g., ground power supply voltage Vss) is supplied at ground power supply terminal 102. Incoming light can be detected using photodiode 100 after passing through a color filter element and converted into electrical charge.

In particular, photodiode 100 may have a p-type terminal that is connected to ground terminal 102 and an n-type terminal that is coupled to a floating diffusion (FD) node 106 via charge transfer transistor 104. Reset transistor 108 may be coupled between floating diffusion node 106 and power supply terminal 110. Source follower transistor 112 has a gate G that is connected to FD node 106, a drain D that is coupled to power supply terminal 110, and a source S that is coupled to pixel output path 116 via row select transistor 114. Output path 116 of each pixel 22 may be connected to a shared column line 118 that is connected to readout circuitry 120.

Before an image is acquired, reset control signal RST may be asserted. Asserting signal RST turns on reset transistor 108 and resets floating diffusion node 106 to Vaa or another reset-level voltage. The reset control signal RST may then be deasserted to turn off reset transistor 114. After the reset process is complete, transfer gate control signal TX may be asserted to turn on charge transfer transistor 104. When transistor 104 is turned on, charge that has been collected at photodiode 100 in response to incoming light may be transferred to floating diffusion region 106. The signal associated with the charge stored in region 106 may be conveyed to row select transistor 114 via source-follower transistor 112.

When it is desired to read out the value of the stored charge (i.e., the value of the stored charge that is represented by the signal at the source S of transistor 112), row select control signal RS may be asserted. When signal RS is asserted, transistor 114 is turned on and a corresponding signal Vout that is representative of the magnitude of the charge on floating diffusion node 106 (e.g., a reset-level or an image-level from photodiode 100) is produced on output path 116. Image pixel array 20 may include hundreds or thousands of image sensor pixels 22 arranged in rows and columns. When row select control signal RS is asserted in a given row, a path such as column line 118 is used to route signal Vout from that image pixel to readout circuitry. Reset-levels and image levels are sampled, held, and converted for each image pixel 22 to allow for noise compensation. The circuitry of FIG. 2 is merely illustrative. If desired, pixel 22 may include other pixel circuitry.

Figure 3:
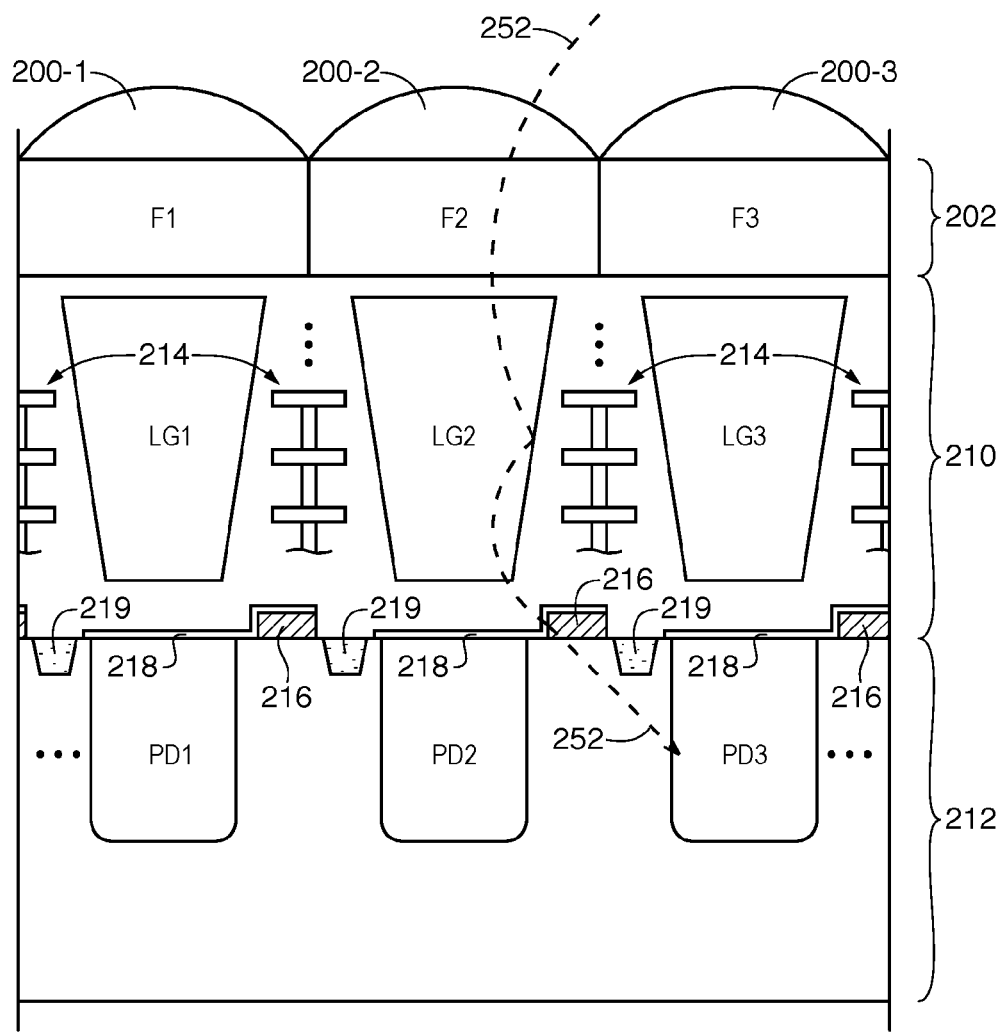
FIG. 3 is a cross-sectional side view of conventional image sensor pixels having light guides.

FIG. 3 is a cross-sectional side view showing three adjacent conventional image sensor pixels. As shown in FIG. 3, photodiode PD1 that is part of a first image sensor pixel, photodiode PD2 that is part of a second image sensor pixel, and photodiode PD3 that is part of a third image sensor pixel are formed in a p-type substrate 212. Circuitry such as shallow trench isolation (STI) structures 219 and polysilicon gate conductors 216 (i.e., gate conductors associated with the various pixel transistors) are formed on substrate 212 between neighboring photodiodes.

A dielectric stack 210 is formed on substrate 212. Dielectric stack 210 can be formed from silicon oxide. A first light guide LG1 for directing incoming light towards PD1 is formed directly above PD1 in dielectric stack 210. A second light guide LG2 for directing incoming light towards PD2 is formed directly above PD2 in dielectric stack 210. A third light guide LG3 for directing incoming light towards PD3 is formed directly above PD3 in dielectric stack 210. Metal interconnect routing paths 214 are formed in dielectric stack 210 between each pair of adjacent light guides. At least some metal routing paths make contact with the gate conductors of the various pixel transistors.

A color filter array 202 is formed over dielectric stack 210. In particular, a first filter element F1 is formed on stack 210 directly above PD1; a second filter element F2 is formed on stack 210 directly above PD2; and a third filter element F3 is formed on stack 210 directly above PD3. First filter element F1 may be configured to pass green light; second filter element F2 may be configured to pass red light; and third filter element F3 may be configured to pass green light. A first microlens 200-1 that is configured to focus light towards PD1 can be formed on first filter element F1. A second microlens 200-2 that is configured to focus light towards PD2 can be formed on second filter element F2. A third microlens 200-3 that is configured to focus light towards PD3 can be formed on second filter element F3.

Ideally, incoming light 250 enters microlenses 200 from above and is directed towards the corresponding photodiodes. For example, light entering microlens 200-1 should be directed towards PD1, whereas light entering microlens 200-2 should be directed towards PD2. In practice, however, stray light may potentially strike regions on substrate 212 between adjacent photodiodes and result in undesired crosstalk and degradation in the pixel modulated transfer function. Regions on substrate 212 where light should not be allowed to strike may be referred to as "dark" regions.

In an effort to reduce crosstalk and increase pixel efficiency, antireflective coating (ARC) material 218 may be deposited to cover the photodiodes and gate conductors 216. ARC material formed in this way can help prevent light from being reflected off the surface of substrate 212. In practice, however, stray light striking the silicon oxide/polysilicon interface (i.e., the interface between dielectric stack 210 and polysilicon 216) may be scattered towards the substrate in random directions, which increases crosstalk. Similarly, stray light hitting the STI/silicon interface (i.e., the interface between STI 219 and the crystalline silicon of substrate 212) may also be scattered towards unintended photodiodes, which increases crosstalk. It may therefore be desirable to provide image sensor pixels with improved crosstalk mitigation capabilities.

Figure 4:
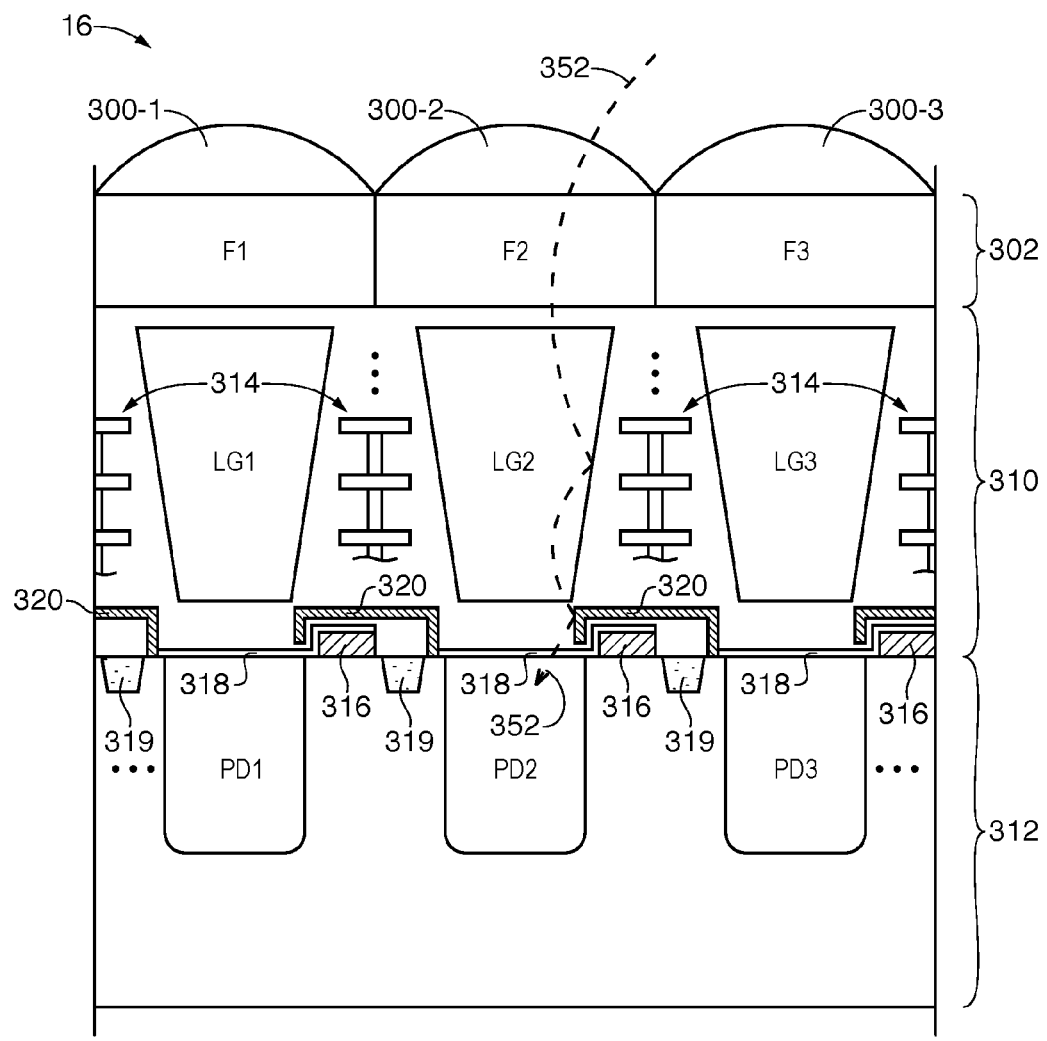
FIG. 4 is a cross-sectional side view of illustrative image sensor pixels having light guides and buried light shielding structures in accordance with an embodiment of the present invention.

In accordance with an embodiment of the present invention, image sensor 16 may be provided with light shielding structures that prevent light from entering regions in the substrate between adjacent photodiodes (see, e.g., FIG. 4). FIG. 4 shows three neighboring image pixels in pixel array 20. As shown in FIG. 4, a first photosensitive element such as photodiode PD1 that is associated with a first pixel 22, a second photosensitive element such as photodiode PD2 that is associated with a second pixel 22, and a third photosensitive element such as photodiode PD3 that is associated with a third pixel 22 may be formed in a semiconductor substrate such as substrate 312 (e.g., a p-type semiconductor substrate). Pixel circuitry such as transistor gate conductors 316 (e.g., polysilicon gate structures associated with various control transistors in pixel 22), image pixel isolation structures such as shallow trench isolation (STI) structures 319, floating diffusion regions FD, and other pixel structures may be formed in regions of substrate 312 between adjacent photodiodes.

Antireflective coating (ARC) material such as an absorptive antireflective liner 318 may be formed over at least the photodiodes and the associated polysilicon gate conductors. ARC liner 318 may serve to prevent light striking the photodiodes and the polysilicon gate structures from being reflected back up away from the top surface of substrate 312.

A dielectric stack such as dielectric stack 310 may be formed on substrate 312. Dielectric stack 310 may be formed from dielectric material such as silicon oxide ($SiO_2$). A first light guide LG1 that is used to direct light toward PD1 may be formed in dielectric stack 310 above PD1. A second light guide LG2 that is used to direct light toward PD2 may be formed in dielectric stack 310 above PD2. A third light guide LG3 that is used to direct light toward PD3 may be formed in dielectric stack 310 above PD3. Interconnect routing structures 314 (e.g., conductive signal routing paths and conductive vias) may be formed in dielectric stack 310 between adjacent light guides. Dielectric stack 310 may therefore sometimes be referred to as an interconnect stack.

A color filter array such as color filter array structure 302 may be formed on top of dielectric stack 310. In the example of FIG. 4, a first color filter element F1 may be formed on stack 310 above LG1; a second color filter element F2 may be formed on stack 310 above LG2; and a third color filter element F3 may be formed on stack 310 above LG3. Filter element F1 may serve to pass light in a first portion of the visible spectrum; filter element F2 may serve to pass light in a second portion of the visible spectrum that is different than the first portion; and filter element F3 may serve to pass light in a third portion of the visible spectrum that is different than the first and second portions. If desired, color filter elements F1, F2, and F3 may each be configured to pass through a selected one of: green light, red light, blue light, cyan light, magenta light, yellow light, and/or other types of light.

A microlens array may be formed on top of color filter array 302. The microlens array may include a first microlens 300-1 formed on top of first color filter element F1, a second microlens 300-2 formed on top of second color filter element F2, and a third microlens 300-3 formed on top of third color filter element F3. Microlens 300-1 may be used to focus light towards PD1. Microlens 300-2 may be used to focus light towards PD2. Microlens 300-3 may be used to focus light towards PD3.

Light shielding structures, sometimes referred to as buried light shielding (BLS) structures 320, may be formed on substrate 312 to prevent stray light from entering regions on substrate 312 located between adjacent photodiodes (e.g., structures 320 may be configured to prevent pixel structures such gate conductors 316 and STI structures 319 from being exposed to incoming light). Buried light shielding structures 320 may be formed from tungsten, copper, gold, silver, aluminum, or other suitable conductive material. Buried light shielding structures 320 formed in this way can also help reflect stray light back into the desired photodiodes (as indicated by light path 352), thereby reducing optical pixel crosstalk and improving pixel modulated transfer function (MTF).

Figure 5:
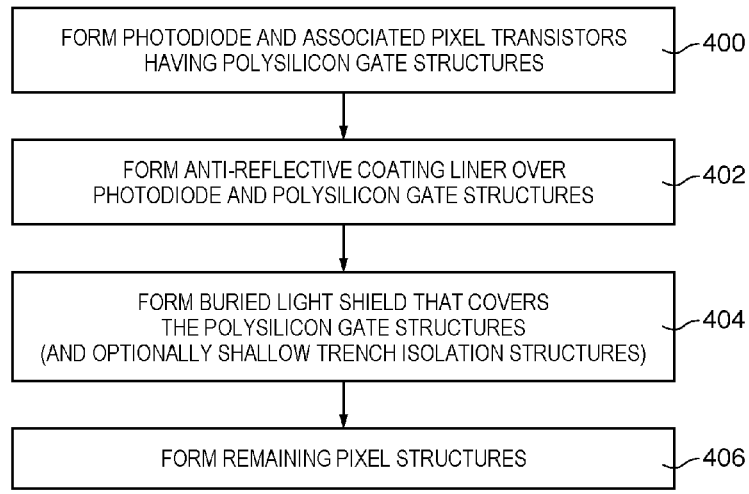
FIG. 5 is a flow chart of illustrative steps involved in forming the image sensor pixels of FIG. 4 in accordance with an embodiment of the present invention.

FIG. 5 is a flow chart of illustrative steps involved in forming the pixel structure of FIG. 4. At step 400. At step 400, an image pixel having polysilicon gate structures, shallow trench isolation structures, and other pixel circuitry (e.g., photodiode 100, floating diffusion region 106, and transistors 104, 108, 112, and 114) may be formed in a semiconductor substrate). At step 402, an antireflective coating (ARC) liner may be formed over at least the photodiodes and the polysilicon gate structures.

At step 404, buried light shield (BLS) structures may be formed over regions on the substrate between each adjacent pair of photodiodes to prevent the gate conductors, shallow trench isolation structures, floating diffusion region, and other pixel circuits from being inadvertently exposed to stray light.

At step 404, antireflective coating material may be selectively deposited on the buried light shield structures. For example, a layer of silicon nitride may be formed to cover the upper surface of the buried light shields. At step 406, a dielectric stack including any interconnect routing structures and light guides may be formed over the semiconductor substrate. Other pixel structures such as a color filter array and a microlens array may subsequently be formed over the dielectric stack. Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The embodiment described thus far relates to front-side illuminated (FSI) image sensors. In general, the embodiments of the present invention can also be applied to backside illuminated (BSI) image sensors and to any image sensor operating in global shutter or rolling shutter mode.

Figure 6:
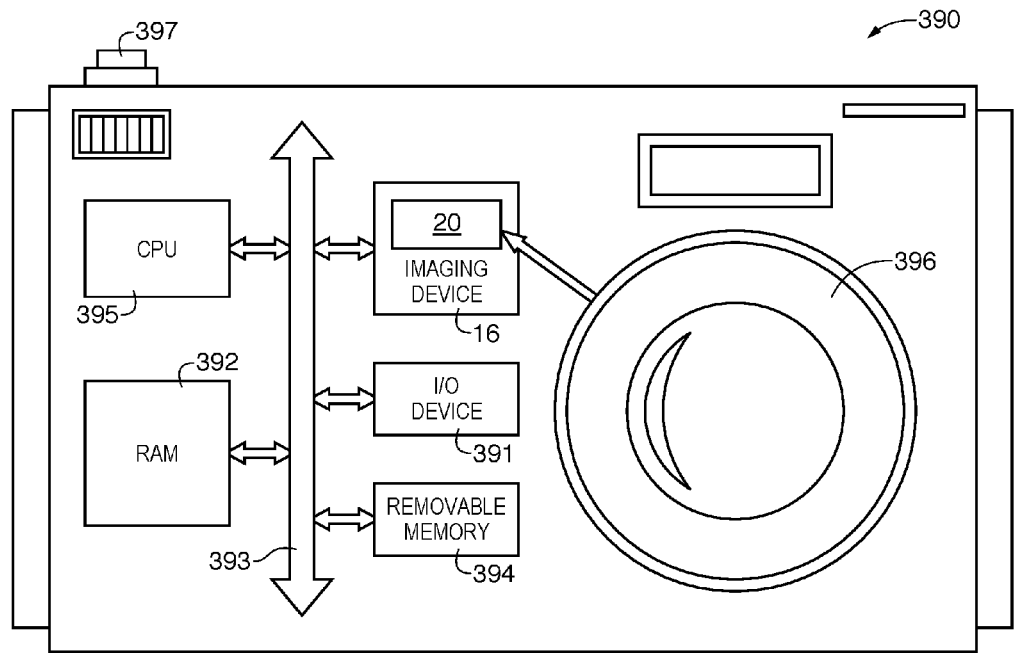
FIG. 6 is a block diagram of a processor system that may employ some of the embodiments of FIGS. 4 and 5 in accordance with an embodiment of the present invention.

FIG. 6 shows, in simplified form, a typical processor system 390. Processor system 390 is exemplary of a system having digital circuits that include imaging device 16 with the buried light shield structures of FIGS. 4 and 5. Without being limiting, such a system could include a computer system, still or video camera system, scanner, machine vision, vehicle navigation, video phone, surveillance system, auto focus system, star tracker system, motion detection system, image stabilization system, video gaming system, video overlay system, and other systems employing an imaging device.

Processor system 390, which may be a digital still or video camera system, may include a lens such as lens 396 for focusing an image onto a pixel array such as pixel array 20 when shutter release button 397 is pressed. Processor system 390 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 16 may also communicate with CPU 395 over bus 393. System 390 may include random access memory (RAM) 392 and removable memory 394. Removable memory 394 may include flash memory that communicates with CPU 395 over bus 393. Imaging device 16 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating imaging systems with buried light shielding structures. A system may include a front-side illuminate (FSI) image sensor module with an array of image sensor pixels and one or more lenses that focus light onto the array of image sensor pixels (e.g., image pixels arranged in rows and columns).

In particular, first and second neighboring photodiodes may be formed in a front surface of a semiconductor substrate. Transistor gate conductors such as polysilicon gate structures, pixel isolation structures such as shallow trench isolation (STI) structures, and other pixel circuits may be formed in the substrate in regions between the first and second adjacent photodiodes. Absorptive antireflective coating (ARC) material may be formed at least over the photodiodes and the polysilicon gate structures.

Buried light shielding structures may be formed on the substrate to cover at least the polysilicon gate structures, STI structures, and the other pixel structures formed in regions between the first and second adjacent photodiodes. A dielectric stack may be formed on the substrate. The dielectric stack may include a first light guide formed over the first photodiode, a second light guide formed over the second photodiode, and interconnect routing structures formed directly over the buried light shielding structures. Buried light shielding structures formed in this way may serve to prevent stray light from inadvertently entering undesired regions on the substrate and can help reduce optical pixel crosstalk.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor, comprising:
a substrate;
first and second adjacent photodiodes formed in the substrate;
a floating diffusion node that is formed between the first and second photodiodes;
a buried light shield structure that is formed on top of the substrate over the floating diffusion node, wherein the buried light shield structure has an elongated horizontal segment that extends parallel to the surface of the substrate and an elongated vertical segment that extends perpendicular to the surface of the substrate;
a shallow trench isolation structure that is formed in the substrate between the first and second photodiodes and that is covered by the buried light shield structure; and
a dielectric stack formed on the substrate, wherein the dielectric stack includes interconnect routing structures that are formed over the buried light shield structure, wherein the buried light shield structure is formed in the dielectric stack.

2. The image sensor defined in claim 1, comprising:
a transistor gate structure that is formed on the substrate between the first and second photodiodes and that is covered by the buried light shield structure.

3. The image sensor defined in claim 2, wherein the transistor gate structure has a top surface and a side surface, wherein the elongated horizontal segment extends parallel to the top surface, and wherein the elongated vertical segment extends parallel to the side surface.

4. The image sensor defined in claim 2, comprising:
antireflective coating material formed over the first and second photodiodes and the transistor gate structure.

5. The image sensor defined in claim 1, further comprising:
a first light guide formed in the dielectric stack over the first photodiode; and
a second light guide formed in the dielectric stack over the second photodiode.

6. The image sensor defined in claim 1, wherein the elongated vertical segment of the buried light shield structure has two vertical surfaces and extends from an end of the elongated horizontal segment of the buried light shield structure.

7. A method of fabricating an image sensor, comprising:
forming first and second neighboring photodiodes in a substrate, wherein the first and second photodiodes are adjacent to a surface of the substrate;
forming first and second light guide structures directly above the first and second photodiodes;
forming a light shielding structure on the substrate between the first and second photodiodes and between the first and second light guide structures; and
forming a transistor gate structure on the substrate that is covered by the light shielding structure.

8. The method defined in claim 7, further comprising:
forming a pixel isolation structure in the substrate that is covered by the light shielding structure.

9. The method defined in claim 7, further comprising:
forming an antireflective coating liner on the transistor gate structure and on the first and second photodiodes.

10. The method defined in claim 7, wherein forming the lighting shielding structure comprises forming a tungsten buried light shield.

11. The method defined in claim 7, further comprising:
forming a dielectric stack on the substrate, wherein the dielectric stack includes interconnect routing structures that are formed directly over the light shielding structure.

12. The method defined in claim 11, wherein forming first and second light guide structures directly above the first and second photodiodes comprises:
forming first and second light guide structures within the dielectric stack.

13. A system, comprising:
a central processing unit;
memory;
a lens;
input-output circuitry; and
an imaging device, wherein the imaging device comprises:
a front-side illuminated image sensor having a plurality of photosensitive elements formed in a substrate;
buried light shields formed on regions of the substrate between each pair of adjacent photosensitive elements;
transistor gate structures that are covered by the buried light shields; and
adsorptive antireflective coating material interposed between the buried light shields and the transistor gate structures.

14. The system defined in claim 13, wherein the plurality of photosensitive elements comprises a plurality of photodiodes.

15. The system defined in claim 13, wherein the transistor gate structures are covered by the buried light shields on at least three sides.

16. The system defined in claim 15, wherein the image sensor further comprises:
shallow trench isolation structures that are covered by the buried light shields.

17. The system defined in claim 16, wherein the absorptive antireflective coating material is formed over the photosensitive elements and the transistor gate structures and not over the buried light shields.

18. The system defined in claim 17, wherein the absorptive antireflective coating material is formed at a region that is non-overlapping with the shallow trench isolation structures.

\* \* \* \* \*